(12) United States Patent
Yoo et al.

(10) Patent No.: US 10,770,398 B2
(45) Date of Patent: Sep. 8, 2020

(54) GRAPHICS PROCESSING UNIT AND HIGH BANDWIDTH MEMORY INTEGRATION USING INTEGRATED INTERFACE AND SILICON INTERPOSER

(71) Applicant: Micron Technology, Inc., Boise, ID (US)

(72) Inventors: Chan H. Yoo, Boise, ID (US); Owen R. Fay, Meridian, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/180,538

(22) Filed: Nov. 5, 2018

(65) Prior Publication Data

US 2020/0144189 A1     May 7, 2020

(51) Int. Cl.
| | |
|---|---|
| *H01L 23/538* | (2006.01) |
| *H01L 27/108* | (2006.01) |
| *H01L 27/092* | (2006.01) |
| *H01L 25/18* | (2006.01) |

(52) U.S. Cl.
CPC ...... *H01L 23/5385* (2013.01); *H01L 23/5386* (2013.01); *H01L 25/18* (2013.01); *H01L 27/0922* (2013.01); *H01L 27/10805* (2013.01)

(58) Field of Classification Search
CPC ............. H01L 23/5385; H01L 23/5386; H01L 27/10805; H01L 27/0922; H01L 25/18
USPC ....... 257/774, 506, 686, 693, 737, 751, 777, 257/E21.505, E21.506, E21.577, E23.021, 257/E23.069, E23.08, E23.142, E23.168, 257/E25.013; 438/107, 108, 113, 613, 438/618, 667; 710/100; 711/154
See application file for complete search history.

(56) References Cited

U.S. PATENT DOCUMENTS

| | | | |
|---|---|---|---|
| 7,619,441 B1* | 11/2009 | Rahman ........... | H03K 19/17796 326/38 |
| 9,917,026 B2* | 3/2018 | Oikawa ................... | H01L 23/00 |
| 10,291,397 B2* | 5/2019 | McElheny ........ | H01L 23/49833 |
| 2009/0108427 A1* | 4/2009 | Caron .................... | H01L 21/486 257/685 |
| 2014/0001639 A1* | 1/2014 | Hiraishi .................. | H01L 23/48 257/773 |
| 2014/0035093 A1* | 2/2014 | Pincu .................. | H01L 25/0657 257/506 |

(Continued)

*Primary Examiner* — Dao H Nguyen
(74) *Attorney, Agent, or Firm* — Parsons Behle & Latimer

(57) ABSTRACT

A semiconductor device assembly that includes a second side of an interposer being connected to a first side of a substrate. A plurality of interconnects may be connected to a second side of the substrate. First and second semiconductor devices are connected directly to the first side of the interposer. The interposer is configured to enable the first semiconductor device and the second semiconductor device to communicate with each other through the interposer. The interposer may be a silicon interposer that includes complementary metal-oxide-semiconductor circuits. The first semiconductor device may be a processing unit and the second semiconductor device may be a memory device, which may be a high bandwidth memory device. A method of making a semiconductor device assembly includes attaching both a memory device and a processing unit directly to a first side of an interposer and connecting a second side of the interposer to a substrate.

17 Claims, 4 Drawing Sheets

(56) References Cited

U.S. PATENT DOCUMENTS

| | | | |
|---|---|---|---|
| 2014/0089609 A1* | 3/2014 | Kegel | H01L 23/49827 711/154 |
| 2014/0181458 A1* | 6/2014 | Loh | G06F 12/1027 711/206 |
| 2014/0360767 A1* | 12/2014 | Terui | H01L 24/19 174/261 |
| 2015/0028918 A1* | 1/2015 | Hutton | H03K 19/0033 326/9 |
| 2015/0123265 A1* | 5/2015 | Lowney | H01L 24/14 257/737 |
| 2015/0262972 A1* | 9/2015 | Katkar | H01L 21/561 257/48 |
| 2016/0085899 A1* | 3/2016 | Qian | H01L 23/5386 257/774 |
| 2018/0102776 A1* | 4/2018 | Chandrasekar | H01L 24/16 |
| 2018/0157782 A1* | 6/2018 | Rossi | G06F 17/5077 |
| 2018/0158771 A1* | 6/2018 | Akiba | H01L 23/49827 |
| 2018/0358280 A1* | 12/2018 | Gandhi | H01L 21/4817 |
| 2019/0172787 A1* | 6/2019 | Arguin | H01L 23/5381 |
| 2019/0287956 A1* | 9/2019 | Raorane | H01L 23/5226 |
| 2019/0303042 A1* | 10/2019 | Kim | G06F 3/0659 |

\* cited by examiner

GRAPHICS PROCESSING UNIT AND HIGH BANDWIDTH MEMORY INTEGRATION USING INTEGRATED INTERFACE AND SILICON INTERPOSER

FIELD

The embodiments described herein relate to semiconductor device assemblies and methods of making semiconductor device assemblies having a processing unit and a memory device directly connected to an interposer that is connected to a substrate, such as a printed circuit board. The interposer may be a silicon interposer having complementary metal-oxide-semiconductor (CMOS) circuits. The processing unit may be a graphics processing unit (GPU) and the memory device may be a high bandwidth memory device.

BACKGROUND

High bandwidth memory typically is a high-performance random-access memory (RAM) interface that includes a stack of dynamic random-access memory (DRAM) having through silicon vias (TSVs) through the DRAM stack. The high bandwidth memory is typically packaged in a specific configuration to enable the high bandwidth memory to be used by another device, such as, but not limited to a graphics card.

FIG. 6 shows a side view schematic of a prior semiconductor device assembly 400 that includes a plurality of hybrid memory cube (HMC) 430 offered by Micron Technology of Boise, Id. The HMC includes multiple memory cells, usually four (4) to eight (8), stacked on top of each other and uses TSVs to interconnect the memory cells. The HMC includes a memory controller, which is integrated as a separate die. Microbumps on a bottom surface of the HMC may be used to connect the HMC to another device, such as, but not limited to, a graphics card.

The semiconductor device assembly 400 includes a substrate, or printed circuit board (PCB), 410 having a first, or top, side 411 and a second, or bottom, side 412, which is opposite of the first side 411. A silicon interposer 420 is connected to the first side 411 of the substrate 410. The interposer 420 has a first, or top, side 421 and a second, or bottom, side 422, which is opposite of the first side 421. A plurality of interconnects 401 on the second side 412 of the substrate 410 may be used to connect the semiconductor device assembly 400 to another device as would be appreciated by one of ordinary skill in the art. The semiconductor device assembly 400 may include a plurality of interconnect elements (not shown) between each component of the semiconductor device assembly 400 as would be appreciated by one of ordinary skill in the art.

A GPU 440 is connected directly to the first side 421 of the interposer 420. The semiconductor device assembly 400 includes at least one HMC 430. For example, four HMC's 430 may be connected to the semiconductor device assembly 400. However, the HMC's 430 are not connected directly to the first side 421 of the interposer 420. Rather, each HMC 430 is connected to a controller, or interface, die 450. Then the assembly comprised of the HMC 430 and the controller die 450 is connected to the interposer 420. The semiconductor device assembly 400 requires a controller die 450 between each HMC 430 and the interposer 420 increasing the cost and/or complexity of the semiconductor device assembly 400.

Additional drawbacks and disadvantages may exist.

Figure 1:
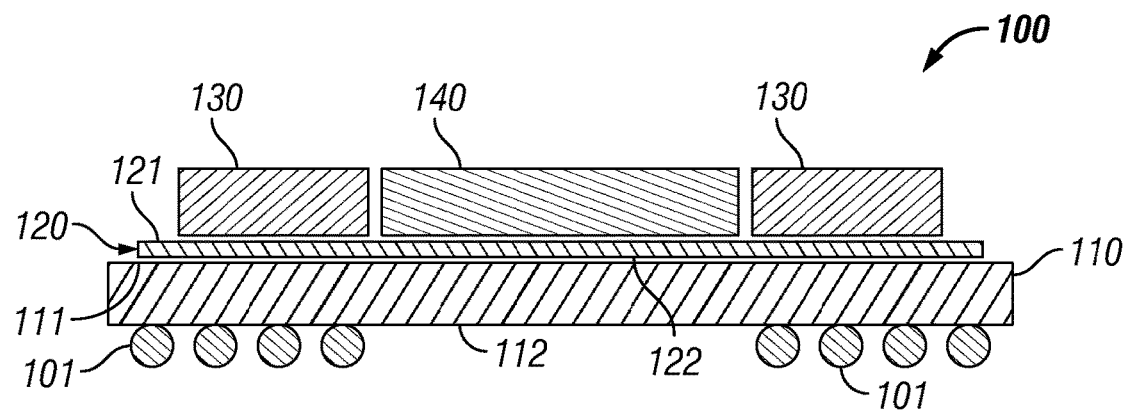
FIG. 1 is a side view schematic of an embodiment of a semiconductor device assembly.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices and semiconductor device packages may not be shown and/or may not be described in detail to avoid obscuring other aspects of the disclosure. In general, it should be understood that various other devices, systems, and/or methods in addition to those specific embodiments disclosed herein may be within the scope of the present disclosure.

The terms "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, semiconductor device packages, and methods of making and/or operating semiconductor devices.

An embodiment of the disclosure is a semiconductor device assembly comprising a substrate having a first side and a second side and an interposer having a first side and a second side, the second side of the interposer being connected to the first side of the substrate. The semiconductor device assembly includes a plurality of interconnects connected to the second side of the substrate and a first semiconductor device connected directly to the first side of the interposer. The semiconductor device assembly includes a second semiconductor device connected directly to the first side of the interposer, wherein the interposer is configured to enable the first semiconductor device and the second semiconductor device to communicate with each other through the interposer.

An embodiment of the disclosure is a semiconductor device assembly comprising a substrate having a first side and a second side and a silicon interposer having a first side and a second side, the second side of the interposer being connected to the first side of the substrate. The silicon interposer having CMOS circuits. The semiconductor device assembly includes a GPU connected directly to the first side of the interposer and a plurality of memory devices connected directly to the first side of the interposer, wherein the silicon interposer is configured to enable the GPU and the plurality of memory devices to communicate with each other through the silicon interposer.

An embodiment of the disclosure is a method of making a semiconductor device assembly. The method comprises attaching a memory device directly onto a first side of an interposer and attaching a processing unit directly onto the first side of the interposer. The method comprises attaching a second side of the interposer to a first side of a substrate, wherein the processing unit and the memory device are configured to communicate with each other through the interposer.

FIG. 1 is a side view schematic of an embodiment of a semiconductor device assembly 100. The semiconductor device assembly 100 includes a substrate 110 having a first, or top, side 111 and a second, or bottom, side 112, which is opposite of the first side 111. The substrate 110, may be, but is not limited to a laminated substrate, such as a printed circuit board (PCB). An interposer 120 is connected to a first side 111 of the substrate 110. The interposer 120 has a first, or top, side 121 and a second, or bottom, side 122, which is opposite of the first side 121.

A first semiconductor device 140 is connected directly to the first side 121 of the interposer 120. Likewise, a second semiconductor device 130 is connected directly to the first side 121 of the interposer 120. The first semiconductor device 140 may be a processing unit, such as, but not limited to, a GPU or a central processing unit (CPU). The second semiconductor device 130 may be a memory device. The interposer 120 may be a silicon interposer. CMOS processing may have been applied to the silicon interposer to enable the interposer 120 to be configured to enable communication between the first semiconductor device 140 and the second semiconductor device 130 through the silicon interposer 120. The CMOS processing on the interposer 120 creates CMOS transistor gates within the interposer 120 that function as a buffer for data transfer between the first semiconductor device 140, the second semiconductor device 130, and/or an external device connected to the semiconductor device assembly 100 via the plurality of interconnects 101. The CMOS transistor gates may also function as logic to control data transfer between the first semiconductor device 140, the second semiconductor device 130, and/or an external device connected to the semiconductor device assembly 100 via the plurality of interconnects 101

In an embodiment, the second semiconductor device 130 may be, but is not limited to, a high bandwidth memory device. As used herein, a high bandwidth memory device is a stack of DRAM dies that optionally includes a base die with a memory controller that are interconnected by through silicon vias (TSVs) and having microbumps on a bottom side, a HMC offered by Micron Technology of Boise, Id., or the like.

Figure 2:
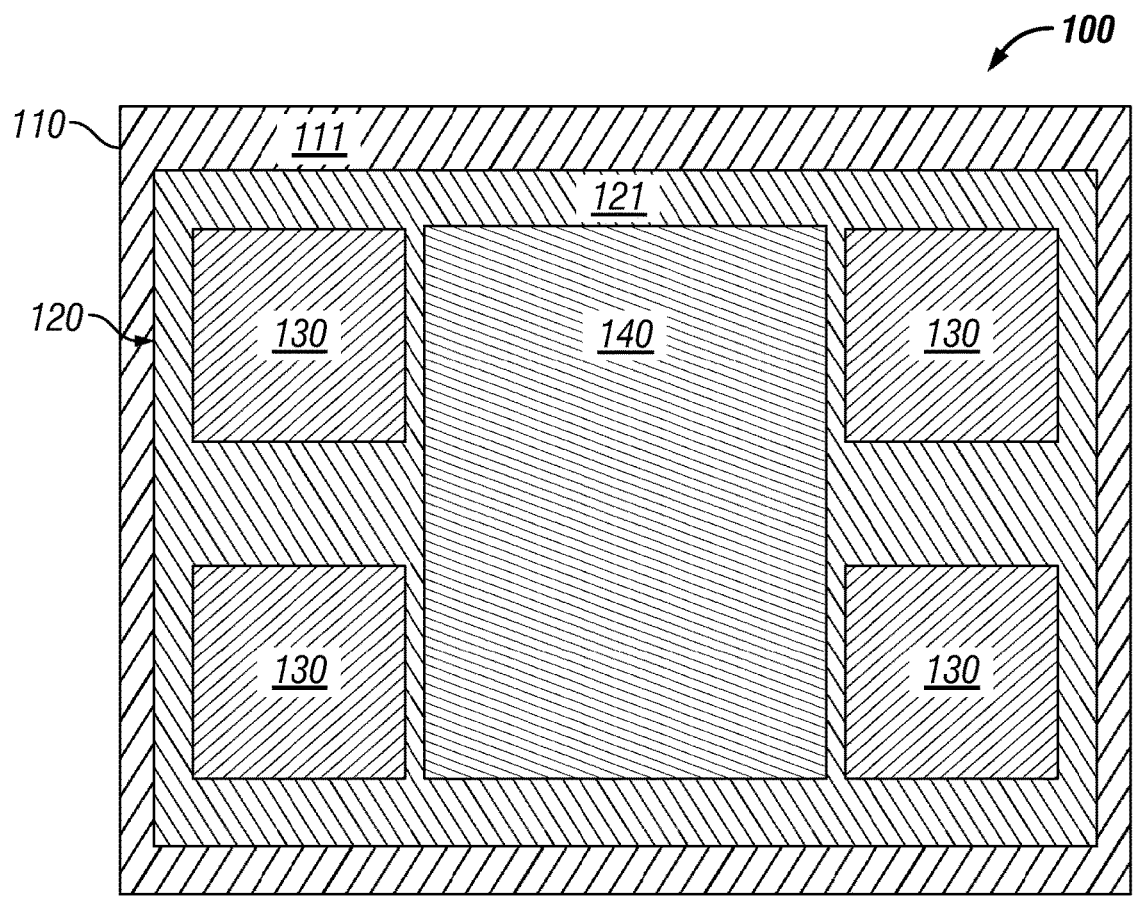
FIG. 2 is a top view schematic of an embodiment of a semiconductor device assembly.

FIG. 2 is a top view schematic of an embodiment of a semiconductor device assembly 100. The semiconductor device assembly 100 includes a substrate 110 having a first, or top, side 111. The substrate 110, may be, but is not limited to a laminated substrate, such as a PCB. An interposer 120 is connected to a first side 111 of the substrate 110. The interposer 120 has a first, or top, side 121. A first semiconductor device 140 is connected directly to the first side 121 of the interposer 120. Likewise, a plurality of second semiconductor devices 130 are connected directly to the first side 121 of the interposer 120. The first semiconductor device 140 may be a processing unit, such as, but not limited to, a GPU and the second semiconductor devices 130 may be high bandwidth memory devices. The interposer 120 may be a silicon interposer. CMOS processing may have been applied to the silicon interposer to enable the interposer 120 to be configured to enable communication between the first semiconductor device 140 and the second semiconductor device 130 through the silicon interposer 120

Figure 3:
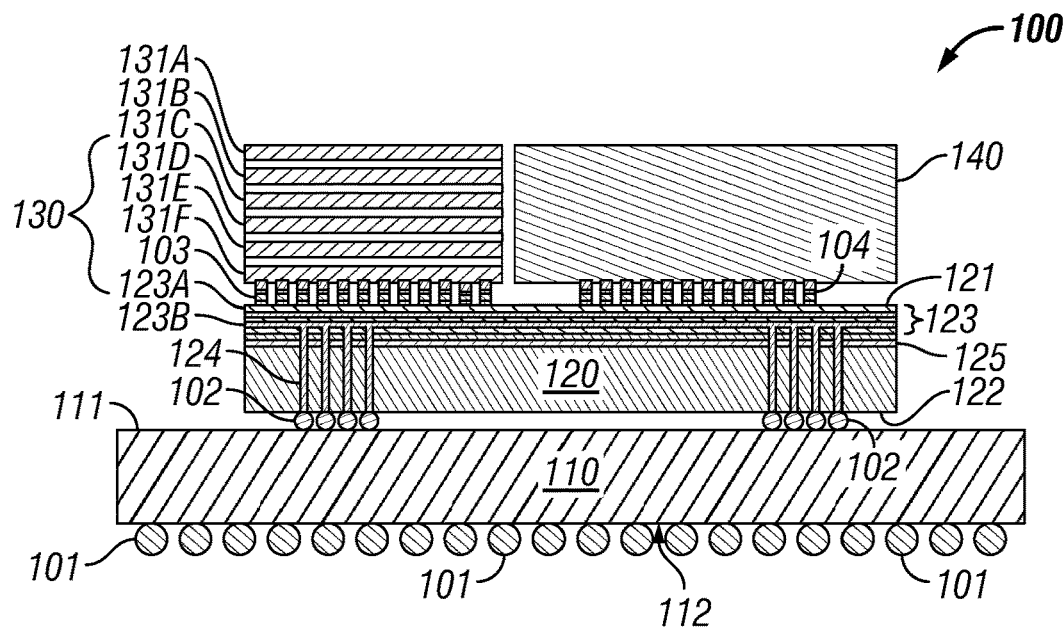
FIG. 3 is a cross-section view schematic of an embodiment of a semiconductor device assembly.

FIG. 3 is a cross-section view schematic of an embodiment of a semiconductor device assembly 100. The semiconductor device assembly 100 includes one or more high bandwidth memory devices 130. The high bandwidth memory device 130 is a stack of memory cells, or dies, 131A-131F that are electrically connected together as would be appreciated by one or ordinary skill in the art having the benefit of this disclosure. The number of memory cells 131A-131F is shown for illustrative purposes and may be varied depending on the application as would be appreciated by one of ordinary skill in the art. The high bandwidth memory device 130 is connected directly to an interposer 120 by a plurality of interconnects 103. A processing unit 140 is also connected directly to the interposer 120 by a plurality of interconnects 104.

The interposer 120 may be a silicon interposer and includes a first, or top, side 121 and a second, or bottom, side 122. CMOS processing may be applied to the interposer 120 as discussed herein as schematically indicated by CMOS layer 125. The CMOS layer 125 of the interposer 120 includes CMOS transistor gates as would be appreciated by one of ordinary skill in the art having the benefit of this disclosure. The size, shape, location, and/or configuration of the CMOS layer 125 is shown for illustrative purpose and may be varied as would be appreciated by one of ordinary skill in the art having the benefit of this disclosure.

A portion of the interposer 120 may include back-end-of-line (BEOL) layers 123. The BEOL layers 123 may be comprised alternating dielectric layers 123A and conductive layers 123B. The BEOL layers 123 provide routing layers within the interposer 120 and electrically connect the high bandwidth memory devices 130 and the processing unit 140 to a plurality of TSVs 124 that extend through the interposer 120 as would be appreciated by one of ordinary skill in the art. The plurality of TSVs 124 connect the high bandwidth memory devices 130 and the processing unit 140 to a plurality of interconnects 102 on the second side 122 of the interposer 120. The interconnects 102 enable the electrical connection to a substrate 110, which may be a PCB. The substrate 110 includes a first, or top, side 111 and a second, or bottom, side 112. A plurality of interconnects 101 on the second side 112 of the substrate 110 enable the semiconductor device assembly 100 to be connected to another device as would be appreciated by one of ordinary skill in the art having the benefit of this disclosure.

Figure 4:
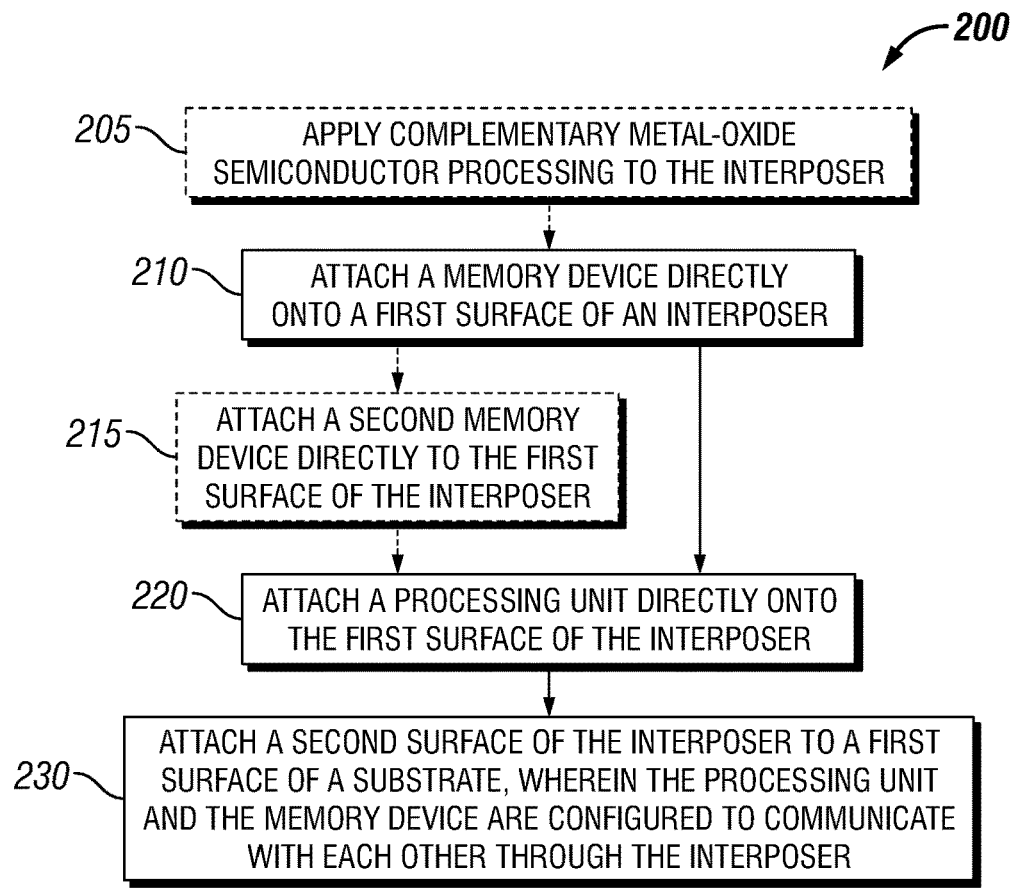
FIG. 4 is a flow chart of an embodiment of a method of making a semiconductor device assembly.

FIG. 4 is a flow chart of an embodiment of a method 200 of making a semiconductor device assembly. The method 200 comprises attaching a memory device directly onto a first surface of an interposer, at 210. The method 200 includes attaching a processing unit directly onto the first surface of the interposer, at 220. At 230, the method 200 includes attaching a second surface of the interposer to a first surface of a substrate, wherein the processing unit and the memory device are configured to communication with each other through the interposer.

The method 200 may include applying CMOS processing to the interposer, at 205, prior to attaching the memory device directly to the interposer. The method 200 may include attaching a second memory device directly to the first surface of the interposer, at 215. A plurality of memory devices may be directly attached to the first surface of the interposer. The memory devices may be high bandwidth memory devices. The processing unit, at 220, may be a GPU.

Figure 5:
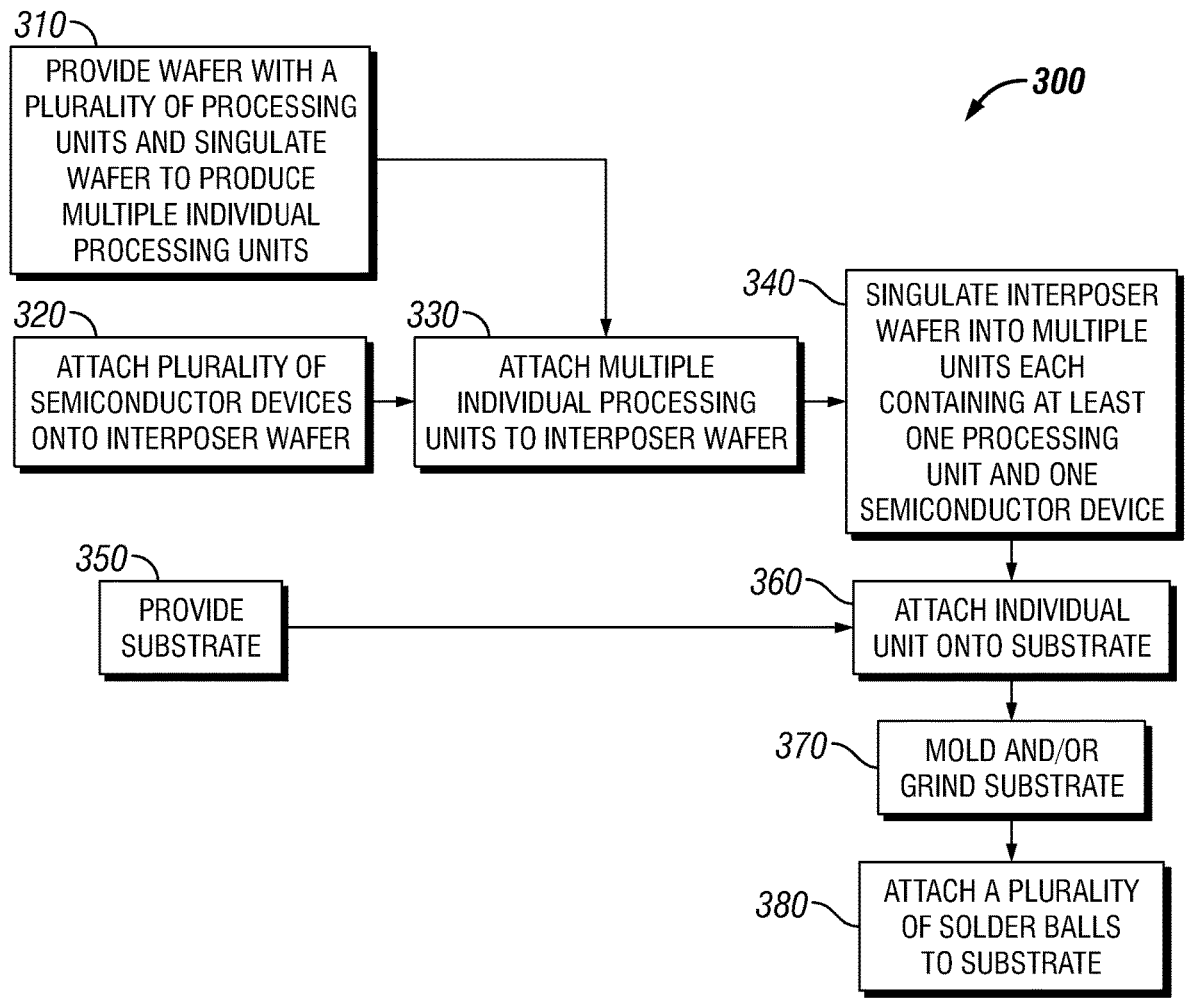
FIG. 5 is a flow chart of an embodiment of a method of making a semiconductor device assembly.
Figure 6:
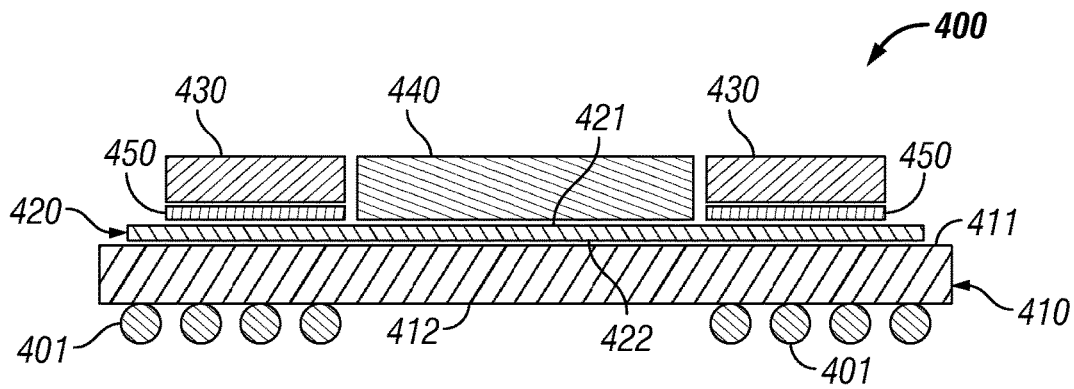
FIG. 6 is a side view schematic of a prior semiconductor device assembly.

FIG. 5 is a flow chart of an embodiment of a method 300 of making a semiconductor device assembly. The method 300 includes providing a wafer with a plurality of processing units attached to the wafer and singulating the wafer to produce multiple individual processing units, at 310. The processing units may be graphics processing units. At 320, the method 300 includes attaching a plurality of semiconductor devices onto an interposer wafer. The semiconductor devices may be memory devices and, in particular, may be high bandwidth memory devices. The method 300 includes attaching multiple individual processing units to the interposer wafer, at 330. The processing units are attached to the interposer wafer in conjunction with one or more semiconductor devices.

The method 300 includes singulating the interposer wafer into multiple units each containing at least one processing unit and at least one semiconductor device, at 340. The method 300 includes providing at substrate, at 350, and attaching individual units onto the substrate, at 360, to form a semiconductor device assembly. The individual units are the units created by the singulation of the interposer wafer, at 340. The method 300 includes molding and/or grinding portions of the substrate, at 370, to better enable the attachment of solder balls to the portions of the substrate and/or for general silicon protection from outside stresses and/or environments. The method 300 includes attaching a plurality of solder balls to the substrate, at 380. The semiconductor device assembly may then be connected to another device, such as, but not limited to, a graphics card.

The method 300 of making a semiconductor device assembly provides for the production of multiple semiconductor devices assemblies using fewer steps than present methods. The method 300 of making a semiconductor device assembly streamlines the process or the prior method of making a semiconductor device assembly as shown herein in regard to FIG. 7.

Figure 7:
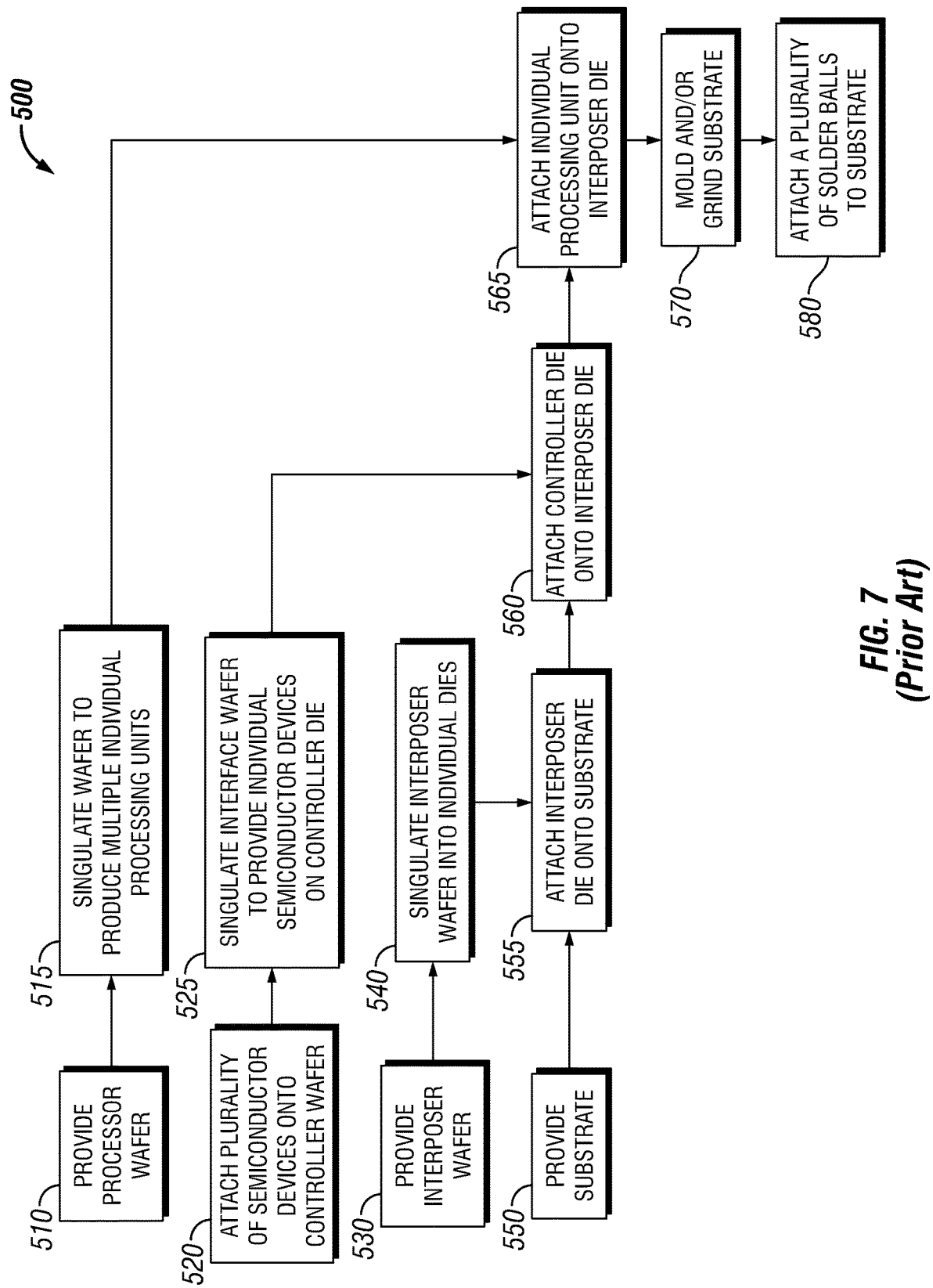
FIG. 7 is a flow chart of a prior method of making a semiconductor device assembly.

FIG. 7 is a flow chart of a prior method 500 of making a semiconductor device assembly. The method 500 includes providing a processor wafer, at 510, and singulating the processor wafer to produce multiple individual processing units, at 515. The method 500 requires attaching a plurality of semiconductor devices, such as high bandwidth memory devices, to a controller, or interface, wafer, at 520, and singulating the controller wafer to provides individual semiconductor devices attached to controller dies, at 525.

The method 500 includes providing an interposer wafer, at 530, and singulating the interpose wafer into individual dies, at 540. The method 500 includes providing a substrate, at 550, and attaching an interposer die onto the substrate, at 555. After, the interposer die is attached to the substrate, the Method 500 includes attaching a controller die, which has a semiconductor device attached to it, onto the interposer die, at 560. The semiconductor device assembly may include a plurality of semiconductor devices. Each semiconductor device is attached to the controller wafer, at 520, and will be attached to the controller die when the controller wafer is singulated, at 525. Each semiconductor device will then need to be attached to the interposer die via the attached controller die, at 560. The method 500 includes attaching an individual processing unit onto the interposer die, at 565. The method 500 includes molding and/or grinding portions of the substrate, at 370, to better enable the attachment of solder balls to the portions of the substrate and/or for general silicon protection from outside stresses and/or environments. The method 300 includes attaching a plurality of solder balls to the substrate, at 380. The semiconductor device assembly may then be connected to another device, such as, but not limited to, a graphics card.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
   a substrate having a first side and a second side;
   an interposer having a first side and a second side, the second side of the interposer connected to the first side of the substrate, wherein the interposer comprises complementary metal-oxide-semiconductor circuits;
   a plurality of electrical interconnects connected to the second side of the substrate;
   a first semiconductor device connected directly to the first side of the interposer;
   a second semiconductor device connected directly to the first side of the interposer, wherein the interposer is configured to enable the first semiconductor device and the second semiconductor device to communicate with each other through the interposer;
   wherein the first semiconductor device is a processing unit;
   wherein the second semiconductor device is a memory device; and wherein the plurality of complementary metal-oxide-semiconductor circuits provide a buffer for data transfer between the first semiconductor device and the second semiconductor device.

2. The semiconductor device assembly of claim 1, wherein the interposer is a substrate comprised of silicon.

3. The semiconductor device assembly of claim 2, wherein the substrate comprises a laminated substrate.

4. The semiconductor device assembly of claim 3, wherein the processing unit further comprises a graphics processing unit (GPU) or a central processing unit (CPU).

5. The semiconductor device assembly of claim 4, further comprising a third semiconductor device connected directly to the first side of the interposer, wherein the third semiconductor device is a memory device and wherein the interposer is configured to enable the GPU or CPU and the third semiconductor device to communicate with each other through the interposer.

6. The semiconductor device assembly of claim 5, wherein the interposer enables communication between the laminated substrate and the GPU or CPU and enables communication between the laminated substrate and the memory device.

7. The semiconductor device assembly of claim 1, wherein the plurality of complementary metal-oxide-semiconductor circuits provides logic to control data transfer between the first semiconductor device and the second semiconductor device.

8. The semiconductor device assembly of claim 1, wherein the memory device further comprises a high bandwidth memory device.

9. A semiconductor device assembly comprising:
a substrate having a first side and a second side;
a silicon interposer having a first side and a second side, the second side of the interposer connected to the first side of the substrate, the silicon interposer having complementary metal-oxide-semiconductor circuits;
a graphics processing unit (GPU) or central processing unit (CPU) connected directly to the first side of the interposer;
a plurality of memory devices connected directly to the first side of the interposer, wherein the silicon interposer is configured to enable the GPU or CPU and the plurality of memory devices communicate with each other through the silicon interposer; and
wherein the complementary metal-oxide-semiconductor circuits provide a buffer for data transfer between the GPU or CPU and the plurality of memory devices.

10. The semiconductor device assembly of claim 9, wherein the substrate is a printed circuit board.

11. The semiconductor device assembly of claim 10, wherein the plurality of memory devices comprises at least two high bandwidth memory devices.

12. A method of making a semiconductor device assembly comprising:
attaching a memory device directly onto a first side of an interposer;
attaching a processing unit directly onto the first side of the interposer;
attaching a second side of the interposer to a first side of a substrate, wherein the processing unit and the memory device are configured to communicate with each other through the interposer; and
applying complementary metal-oxide-semiconductor processing to the interposer before attaching the memory device directly onto the first side of the interposer to form complementary metal-oxide-semiconductor circuits, wherein the complementary metal-oxide-semiconductor circuits provide a buffer for data transfer between the processing unit and the memory device.

13. The method of claim 12, comprising attaching a second memory device directly to the first side of the interposer and wherein the substrate comprises a printed circuit board.

14. A method of making a semiconductor device assembly comprising:
attaching a plurality of memory devices directly onto a first side of an interposer wafer;
attaching a plurality of individual processing units onto the first side of the interposer wafer;
processing the interposer wafer to form a plurality of individual semiconductor device assemblies each comprising at least one semiconductor device and an individual processing unit;
attaching a second side of an individual semiconductor device assembly to a first side of a substrate; and
applying complementary metal-oxide-semiconductor processing to the interposer wafer prior to attaching the plurality of semiconductor devices onto a first side of an interposer wafer to form complementary metal-oxide semiconductor circuits, wherein the complementary metal-oxide-semiconductor circuits provide a buffer for data transfer between the plurality of individual processing units and the plurality of memory devices.

15. The method of claim 14, comprising providing a wafer having the plurality of graphics processing units connected to a side of the wafer and processing the wafer to form the plurality of individual processing units.

16. The method of claim 15, wherein the individual processing units comprise graphics processing units or central processing units.

17. The method of claim 16, attaching a plurality of solder balls to a second side of the substrate.

* * * * *